(12) United States Patent
Almadori et al.

(10) Patent No.: US 10,109,484 B2
(45) Date of Patent: Oct. 23, 2018

(54) METHOD FOR PRODUCING NANOCRYSTALS WITH CONTROLLED DIMENSIONS AND DENSITY

(71) Applicant: Commissariat A L'Energie Atomique et aux Energies Alternatives, Paris (FR)

(72) Inventors: Yann Almadori, Meylan (FR); Jean-Charles Barbe, Izeron (FR); Lukasz Borowik, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 115 days.

(21) Appl. No.: 15/390,901

(22) Filed: Dec. 27, 2016

(65) Prior Publication Data

US 2017/0186612 A1 Jun. 29, 2017

(30) Foreign Application Priority Data

Dec. 28, 2015 (FR) ...................................... 15 63394

(51) Int. Cl.
*H01L 21/02* (2006.01)
*H01L 21/324* (2006.01)
*H01L 21/265* (2006.01)

(52) U.S. Cl.
CPC .. *H01L 21/02694* (2013.01); *H01L 21/02381* (2013.01); *H01L 21/02488* (2013.01);
(Continued)

(58) Field of Classification Search
CPC ........... H01L 21/0261; H01L 21/02694; H01L 21/02532; H01L 21/02381;
(Continued)

(56) References Cited

U.S. PATENT DOCUMENTS

| 6,958,265 B2 * | 10/2005 | Steimle | B82Y 10/00 |
| | | | 257/E21.209 |
| 7,713,850 B2 * | 5/2010 | Vinet | B82Y 10/00 |
| | | | 257/E21.054 |

(Continued)

FOREIGN PATENT DOCUMENTS

| EP | 1 619 277 A2 | 1/2006 |
| EP | 2 521 161 A1 | 11/2012 |
| EP | 2 521 162 A1 | 11/2012 |

OTHER PUBLICATIONS

Gregory Spencer et al. "Silicon nanoparticle synthesis by short-period thermal anneals at atmospheric pressure in argon", Journal of Vacuum science and Technology A 29, 2011, 7 pages.

(Continued)

*Primary Examiner* — Michael Trinh
(74) *Attorney, Agent, or Firm* — Oblon, McClelland, Maier & Neustadt, L.L.P.

(57) ABSTRACT

Method for producing nanocrystals of semiconductor, comprising at least:
- ion bombardment of a thin layer of semiconductor arranged on at least one dielectric layer, achieving at least one among an implantation of ions of at least one chemical element of rare gas type and an implantation of ions of at least one semiconductor element of same nature as that of the thin layer, in at least one part of the thickness of the thin layer;
- annealing of the thin layer achieving a dewetting of the semiconductor of the thin layer and forming, on the dielectric layer, nanocrystals of semiconductor.

8 Claims, 5 Drawing Sheets

(52) U.S. Cl.
CPC .. *H01L 21/02532* (2013.01); *H01L 21/02598* (2013.01); *H01L 21/02601* (2013.01); *H01L 21/02664* (2013.01); *H01L 21/26506* (2013.01); *H01L 21/324* (2013.01)

(58) Field of Classification Search
CPC ......... H01L 21/02664; H01L 21/02598; H01L 21/26506; H01L 21/324; H01L 21/0259–21/02606; H01L 29/7613; H01L 29/66439
See application file for complete search history.

(56) References Cited

U.S. PATENT DOCUMENTS

| | | | | |
|---|---|---|---|---|
| 8,647,957 | B2* | 2/2014 | Borowik | B82Y 10/00 438/378 |
| 8,697,548 | B2 | 4/2014 | Borowik et al. | |
| 2006/0019459 | A1 | 1/2006 | Vinet et al. | |
| 2007/0228378 | A1* | 10/2007 | Fournel | B81C 1/00031 257/72 |
| 2008/0246077 | A1* | 10/2008 | Park | B82Y 10/00 257/324 |
| 2012/0282758 | A1 | 11/2012 | Borowik et al. | |
| 2012/0282759 | A1 | 11/2012 | Borowik et al. | |

OTHER PUBLICATIONS

I. Berbezier et al. "Ordered arrays of Si and Ge nanocrystals via dewetting of pre-patterned thin films", Journal of Applied Physics, 2013, 7 pages.

A. Le Bris et al. "Self-Organized ordered silver nanoparticle arrays obtained by solid state dewetting" Journal of Applied Physics Letters 105, 2013, 6 pages.

Hugo Navas et al. "Interplay of interfacial compounds, catalyst thickness and carbon precursor supply in the selectivity of single-walled carbon nanotube growth", Carbon 80, 2014, 11 pages.

David Quere "Wetting and Roughness", Annual Review of Materials Research, vol. 38, 2008, 29 pages.

French Preliminary Search Report dated Aug. 16, 2016 in French Application 15 63394, filed on Dec. 28, 2015 (with English Translation of Categories of Cited Documents).

Lukasz Borowik et al. "The Influence of Strain on Dewetting of Silicon Films", Journal of Applied Physics, vol. 114, No. 6, 2013, 4 pages.

Hiroya Ikeda et al. "In-Situ observation of formation process of self-assembled Si islands on buried $SiO_2$ and their Crystallographic structures", Microprocesses and nanotechnology conference, 2003, 2 pages.

B. Legrand et al. "Thermally assisted formation of silicon islands on a silicon-on-insulator substrate", Journal of Applied Physics 91, 2002, 7 pages.

A.G. Cullis et al. "Comparative study of annealed neon-, argon-, and krypton-ion implantation damage in silicon", Journal of Applied Physics 49, 1978, 12 pages.

G. Capellini et al "Agglomeration process in thin silicon-, strained silicon-, and silicon germanium-on-insulator substrates", Journal of Applied Physics, 2009, 9 pages.

Yasuhiko Ishikawa et al. "Effect of patterning on thermal agglomeration of ultrathin silicon-on-insulator layer", Applied Surface Science 190, 2002, 5 pages.

U.S. Appl. No. 15/049,468, filed Feb. 22, 2016, 2015/0254362 A1, Sylvain Maitrejean et al.

* cited by examiner

METHOD FOR PRODUCING NANOCRYSTALS WITH CONTROLLED DIMENSIONS AND DENSITY

TECHNICAL FIELD AND PRIOR ART

The present document relates to a method for producing nanocrystals, or nanoparticles, of semiconductor obtained by dewetting of a thin layer of semiconductor arranged on a dielectric layer, and being able to be used for the production of microelectronic and/or nanoelectronic devices, for example memory devices or light emitting devices of LED type, or the production of holes or vias of controlled dimensions, distributed for example in the form of a quasi-periodical array, obtained thanks to a chemical reaction between the nanocrystals of semiconductor and the dielectric layer on which the nanocrystals are produced. This also applies to the formation of nano-catalyst particles such as carbon nanotubes, or the adaptation of surface wetting properties used for example to produce super-hydrophobic surfaces.

It is known to produce nanocrystals of semiconductor, that is to say aggregates of semiconductor of which the dimensions may be between around several nanometres and several hundreds of nanometres, by dewetting of a thin layer of semiconductor, for example silicon or SiGe, arranged on a dielectric layer of $SiO_2$. When the thin layer of semiconductor, forming for example the active layer, or superficial layer, of a SOI (silicon on insulator) or SGOI (silicon-germanium on insulator) substrate, is subjected to high temperature annealing, for example between around 650° C. and 1250° C., the semiconductor of this thin layer progressively retracts on itself forming nanocrystals of this semiconductor.

The document EP 1 619 277 A2 describes that it is possible to localise precisely the areas of the layer of semiconductor intended to form nanocrystals by dewetting by carrying out a doping and an insolation by electron beam of these areas, prior to high temperature annealing under hydrogenated atmosphere. This method nevertheless does not make it possible to act on the dimensions of the nanocrystals produced or on the distribution surface density of the nanocrystals.

The document "Thermally assisted formation of silicon islands on a silicon-on-insulator substrate" of B. Legrand et al., Journal of Applied Physics 91, 106 (2002), describes that the dewetting may be influenced by the thickness of the thin layer of semiconductor from which the nanocrystals are produced. The lower this thickness, the smaller the average dimensions of the nanocrystals obtained and the greater the surface density of the nanocrystals on a given surface. By reducing this thickness to around 1.15 nm, it is possible to obtain nanocrystals of radius less than around 20 nm and of surface density equal to 550+/−50 nanocrystals/$\mu m^2$. Nevertheless, in practice, the reduction of the thickness of the thin layer of semiconductor poses difficulties of obtaining large homogeneous surfaces in terms of thickness, typically at the scale of the substrate or wafer (for example of diameter between 200 mm and 300 mm).

The document "Silicon nanoparticle synthesis by short-period thermal anneals at atmospheric pressure in argon" of G. Spencer et al., Journal of Vacuum Science and Technology A 29, 051508 (2011), describes the possibility of modifying the dimensions of the nanocrystals by modifying the temperature of an annealing of short duration implemented under argon atmosphere at atmospheric pressure. The higher the temperature at which the annealing is implemented, the larger the average radius of the nanocrystals obtained and the lower the surface density with which the nanocrystals are distributed. Such a method nevertheless does not make it possible to obtain particles of small dimensions, for example of average diameter less than around 50 nm.

The document EP 2 521 161 A1 describes that it is possible to control the surface density and the dimensions of the nanocrystals obtained by dewetting of a thin layer of semiconductor while forming carbon chemical species on this thin layer of semiconductor before the dewetting. The surface density of the carbon chemical species formed on the thin layer of semiconductor is a function of the desired dimensions and surface density of the nanocrystals of semiconductor. The formation of carbon chemical species on the thin layer of semiconductor is nevertheless a restrictive step to implement, which may be incompatible with certain electronic applications.

The document "Agglomeration process in thin-silicon-, strained silicon-, and silicon germanium-on-insulator substrates" of G. Capellini et al., Journal of Applied Physics 105, 093525 (2009), describes that the dewetting may be influenced according to whether or not a stressed layer of semiconductor is used. The greater the bi-axial stress to which the semiconductor is subjected and/or the thinner the layer of semiconductor, the more the dimensions of the nanocrystals of semiconductor obtained are reduced and the greater the surface density of these nanocrystals. The document EP 2 521 162 A1 also describes the possibility of forming, from a stack of a thin layer of semiconductor stressed uni-axially arranged on a dielectric layer, nanocrystals of elongated shape and oriented perpendicularly to the axis of the stress. Nevertheless, obtaining a stress in the semiconductor intended to be dewetted is restrictive and may be incompatible vis-à-vis other implementation stresses.

The documents "Ordered arrays of Si and Ge nanocrystals via dewetting of pre-patterned thin films" of I. Berbezier et al., Journal of Applied Physics 113, 064908 (2013), "Effect of patterning on thermal agglomeration of ultrathin silicon-on-insulator layer" of Y. Ishikawa et al., Applied Surface Science 190 (2002) and "Self-organized ordered silver nanoparticle arrays obtained by solid state dewetting" of A. Le Bris et al., Applied Physics Letters 105, 203102 (2014) describes the possibility of influencing the dewetting properties by an etching of the thin layer of semiconductor and/or the dielectric layer on which is located the thin layer of semiconductor by using a focused ion beam (FIB) or an electron beam printing, before a step of high temperature annealing generating the dewetting. This etching represents an important implementation stress because it requires the use of specific equipment. In addition, such an etching may be incompatible with certain envisaged applications.

DESCRIPTION OF THE INVENTION

There thus exists a need to propose a method for producing nanocrystals of semiconductor making it possible to reduce the dimensions of the nanocrystals and to increase the surface density with which the nanocrystals are distributed, which is notably compatible with obtaining nanocrystals of dimensions for example less than around 50 nm, without having to implement thinning of the thin layer of semiconductor to dewet to obtain a thickness that depends on the desired dimensions for the nanocrystals, add carbon species to the thin layer of semiconductor or induce a stress in the thin layer of semiconductor.

To do so, an embodiment proposes a method for producing nanocrystals, or nanoparticles, of semiconductor, comprising at least the implementation of the following steps:

ion bombardment, or implantation, of a thin layer of semiconductor arranged on at least one dielectric layer, achieving an implantation of ions of at least one chemical element of rare gas type and/or of ions of at least one semiconductor element of same nature as that of the thin layer and/or of ions of at least one doping species, in at least one part of the thickness of the thin layer;

annealing of the thin layer, achieving a dewetting of the semiconductor of the thin layer and forming, on the dielectric layer, nanocrystals of semiconductor.

This method makes it possible to control the dimensions and the surface density of the nanocrystals obtained by dewetting. To do so, the method proposes controlling the dewetting thanks to a treatment of the thin layer of semiconductor by ion bombardment. The longer the duration of the ion bombardment, the smaller the dimensions of the nanocrystals obtained and the higher the surface density with which the nanocrystals are distributed on the dielectric layer. This method notably makes it possible to reduce the dimensions of the nanocrystals, and to obtain in particular nanoparticles of average diameter less than around 50 nm, without having to reduce, prior to the dewetting, the thickness of the thin layer, or to add carbon species to the thin layer of semiconductor or instead to induce stress in the semiconductor.

The ion bombardment carried out does not thin and does not modify the roughness, or more generally the surface properties, of the thin layer of semiconductor in a significant manner. Conversely, this ion bombardment achieves an implantation of ions in at least one part of the thickness of the thin layer of semiconductor, which makes this part of the thickness of the thin layer of semiconductor undergoing the ion implantation amorphous. At fixed incident species energy, the longer the duration of the ion bombardment, the greater the thickness of amorphous semiconductor. The ion bombardment also creates crystalline defects in the semiconductor: dislocations, twins or micro-twins, gas bubbles, interstitial defects, vacancies, etc. This amorphisation of the semiconductor and these crystalline defects created in the semiconductor result, during the annealing leading to the dewetting of the semiconductor, in the formation of nanocrystals that are smaller and dispersed on the dielectric layer with a higher surface density. This is notably linked to the phenomenon of re-crystallisation of the semiconductor which takes place during dewetting.

The fact of carrying out an ion implantation of at least one chemical element of rare gas type and/or an implantation of ions of at least one semiconductor element of same nature as that of the thin layer makes it possible, unlike an implantation of ions of at least one doping species, to obtain thereafter nanocrystals of semiconductor that are not doped by these ions. Thus, the step of ion bombardment implemented does not modify the doping or the absence of doping of the thin layer of semiconductor. It is thus possible to form for example nanocrystals of intrinsic semiconductor, that is to say not doped intentionally.

The duration during which the ion bombardment is implemented may be a function of the energy with which the ions are implanted, the desired dimensions of the nanocrystals of semiconductor and the desired distribution surface density of the nanocrystals of semiconductor on the dielectric layer. This duration is thus, at a given energy, directly proportional to the dose of implanted ions, and is also chosen as a function of the nature of the semiconductor, the thickness of the thin layer, and the nature of the ions. For example, for the production of nanocrystals from a thin layer of silicon deposited on a layer of silicon dioxide (corresponding for example to the superficial layer and the buried dielectric layer of an SOI substrate), an implantation of monoatomic argon carried out with an angle of 45° with respect to the surface of the thin layer of silicon and with an energy of 0.5 keV may be implemented for a duration such that the dose implanted is between around $1 \cdot 10^{13}$ and $1 \cdot 10^{17}$ ions·cm$^{-2}$.

The dose of implanted ions may be such that it is sufficient to induce the creation of structural defects in the semiconductor, notably an amorphisation of the semiconductor, and sufficiently low so as not to abrade the surface of the thin layer in a significant manner, so as not to greatly reduce the film thickness. For a given system, the parameters of the ion bombardment (duration, energy, angle, etc.) implemented may be determined on the basis of a molecular dynamic calculation or within the scope of KMC (Kinetic Monte Carlo) simulations, for example via the use of a CTRIM code.

The ion bombardment may be implemented under a pressure less than or equal to around $10^7$ Pa, that is to say under ultra-vacuum.

The ion bombardment and the annealing may be implemented in an enclosure capable of carrying out an annealing at a temperature between around 700° C. and 1000° C. under controlled atmosphere (for example under vacuum or with an inert gas), such as for example an ultra-vacuum enclosure of an atomic force microscope.

The annealing may be extended until the nanocrystals of semiconductor chemically react with the dielectric layer while forming a plurality of holes, or pores, partially or totally traversing the dielectric layer. The method may in this case correspond to a method for producing a porous dielectric layer.

In this case, the method may further comprise, after the step of annealing, a step of depositing at least one conductive material in the holes. Thus, an array of conductive vias may be formed in the dielectric layer.

BRIEF DESCRIPTION OF THE DRAWINGS

The present invention will be better understood on reading the description of examples of embodiment given purely for indicative purposes and in no way limiting, while referring to the appended drawings, in which.

Identical, similar or equivalent parts of the different figures described hereafter bear the same numerical references so as to make it easier to go from one figure to the next.

The different parts shown in the figures are not necessarily according to a uniform scale, in order to make the figures more legible.

The different possibilities (variants and embodiments) should be understood as not being mutually exclusive and may be combined together.

DETAILED DESCRIPTION OF PARTICULAR EMBODIMENTS

Figure 1:
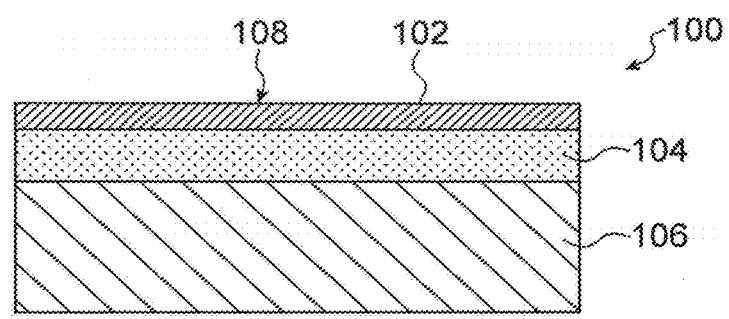
FIGS. 1 to 3 show the steps of a method for producing nanocrystals of semiconductor according to a particular embodiment.
Figure 2:
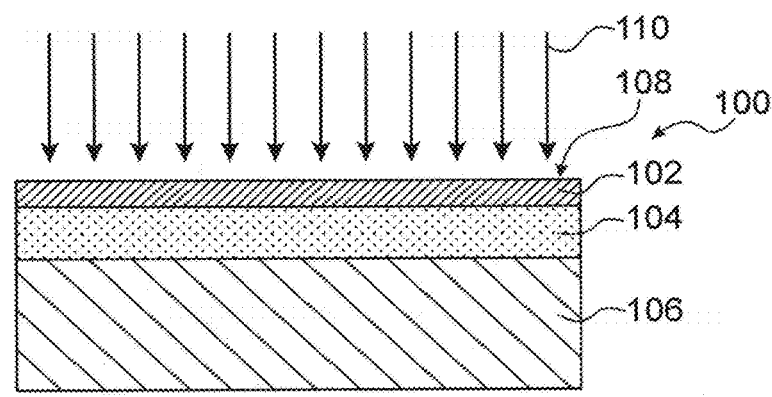
Figure 3:
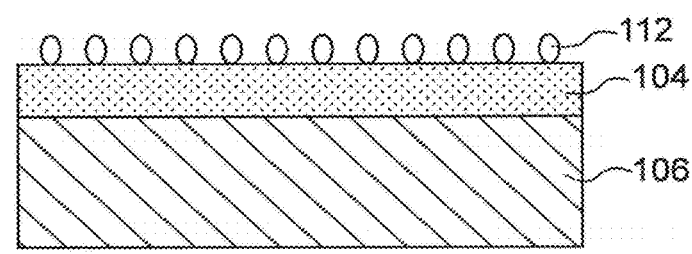

FIGS. 1 to 3 show the steps of a method for producing nanocrystals, according to a particular embodiment, making it possible to control the dimensions and the surface density of the nanocrystals, and notably to obtain nanocrystals of small dimensions distributed with a high surface density.

This method is here implemented from a substrate 100 (shown in FIG. 1) comprising a thin layer 102 of semiconductor, of thickness less than or equal to around 1 µm, and preferably between around 1 nm and 100 nm or advantageously between around 5 nm and 20 nm, arranged on a buried dielectric layer 104, or BOX (Buried Oxide) comprising for example amorphous $SiO_2$. The dielectric layer 104, of which the thickness is for example equal to around 140 nm, rests on a thick layer 106 of monocrystalline silicon of which the thickness is for example equal to around 700 µm and which forms the mechanical support of the substrate 100.

The method is here implemented from two different substrates 100. A first substrate 100 corresponds to a SOI substrate of which the thin layer 102 comprises monocrystalline silicon, for example of crystalline orientation (001). A second substrate 100 corresponds to a SGOI substrate of which the thin layer 102 comprises monocrystalline SiGe, for example $Si_{0.78}Ge_{0.22}$. Generally speaking, the semiconductor of the thin layer 102 may be a semiconductor other than silicon or SiGe, for example germanium or instead a III-V material, for example GaN and/or AsGa and/or AlGaN and/or GaN.

The layers 102 and 104 are chosen such that the dewetting of the material of the layer 102 is possible, for example such that $\gamma_{102}+\gamma_{102,104}-\gamma_{104}>0$, with $\gamma_{102}$ the energy surface density of the material of the layer 102, $\gamma_{104}$ the energy surface density of the material of the layer 104, and $\gamma_{102,104}$ the energy interface density between the layers 102 and 104.

In terms of targeted applications, the layer 102 advantageously comprises monocrystalline semiconductor and the layer 104 is advantageously a dielectric layer or a stack of dielectric layers (for example oxide such as $SiO_2$, $Al_2O_3$, $HfO_2$, etc., and/or nitride such as $Si_3N_4$, $Si_xN_y$, etc., and/or $Si_xO_yN_z$).

The thin layers 102 of silicon and SiGe of the 501 and SGOI substrates 100 are obtained while having undergone beforehand a step of thinning, corresponding for example to the implementation of a high temperature oxidation followed by etching with hydrofluoric acid, such that the thin layer 102 of silicon has a thickness equal to around 7.5+/−1 nm and that the thin layer 102 of SiGe has a thickness equal to around 12+/−1 nm.

Generally speaking, the dielectric layer 104 may correspond to a layer or to a stack of several layers comprising $SiO_2$ and/or $Si_3N_4$ and/or $Si_xN_y$ (non-stoichiometric silicon nitride) and/or $Si_xO_yN_z$ and/or any other suitable material, crystalline or amorphous.

An ion bombardment of the thin layer 102 is then implemented from a front face 108 (the face opposite to that in contact with the dielectric layer 104) of the thin layer 102, in at least one part of the thickness of the thin layer 102 (FIG. 2). This ion bombardment is here carried out with argon ions. Generally speaking, the ion bombardment is carried out with ions of one or more rare, or noble, gases, that is to say comprising one or more chemical elements from group 18 of the periodic table of elements (Ar, Ne, Kr, He, Xe, etc.). In an alternative, it is also possible to use ions of the same semiconductor as that of the thin layer 102, that is to say ions of silicon or germanium for both substrates 100 described here, or instead ions of one or more doping species such as for example boron, phosphorous, arsenic, fluorine or instead $BF_2$, provided that the implanted species induces the same type of defects in the thin layer 102 because for these doping ion species, partial or total amorphisation (as a function of the implanted dose) of the thin layer 102 and the creation of volume structural defects are also obtained.

This ion bombardment is here implemented in an ultra-high vacuum chamber (where a pressure less than or equal to around $10^{-7}$ Pa reigns) of an atomic force microscope (or UHV AFM for Ultra-High Vacuum Atomic Force Microscope), with an ion gun. The ions are sent into the thin layer 102 with an energy for example equal to around 500 eV and using a compensation current equal to around 20 µA. The alignment of the ion beam is carried out for example beforehand with a fluorescent sample. In addition, the ion beam preferably undergoes no fine tuning in order that it is the most homogeneous possible over the entire front face 108 of the thin layer 102. The above parameters make it possible to obtain a beam of diameter equal to around 3 cm. In FIG. 2, this ion beam is symbolised by the arrows 110.

During such an ion bombardment of the thin layer 102, it is difficult to know precisely the dose of ions implanted in the thin layer 102. Thus, control of the dose of implanted ions is advantageously carried out by controlling the duration during which this ion bombardment is implemented. In the examples described below used to illustrate the effects of ion bombardment on dewetting, the ion bombardment is carried out for a duration equal to 1, 2 or 3 minutes.

An annealing of the substrate 100 is then implemented in order to achieve a dewetting of the semiconductor of the thin layer 102 leading to the formation of nanocrystals 112 of semiconductor on the dielectric layer 104 (FIG. 3). This annealing is for example implemented in the ultra-vacuum chamber of the atomic force microscope in which the ion bombardment is also implemented. The calibration of the temperature of implementation of this annealing may be carried out by measuring directly the temperature at the thin layer 102, for example using a pyrometer or a thermocouple. This annealing may be carried out at a temperature between around 700° C. and 1000° C. In the examples described here, the SOI substrate undergoes an annealing at a temperature equal to around 800+/−10° C., and the SGOI substrate undergoes an annealing at a temperature equal to around 750+1-10° C. This annealing is implemented for a duration for example between several minutes and several tens of minutes, for example 10 minutes.

Due to the fact that the dewetting kinetic is controlled by surface diffusion, the higher the annealing temperature, the shorter the duration of the annealing, making it possible to achieve the dewetting of the semiconductor of the thin layer 102 and to form the nanocrystals 112.

Figure 4A:
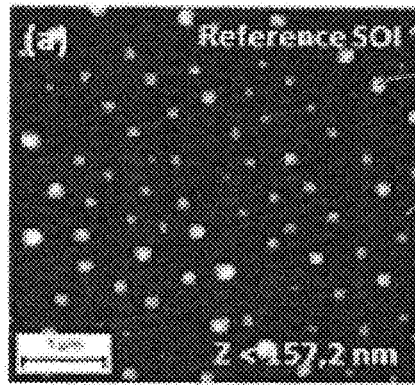
FIGS. 4A to 4D and 5A to 5D show nanocrystals obtained by varying the duration of an ion bombardment implemented in the course of the method for producing nanocrystals.
Figure 4B:
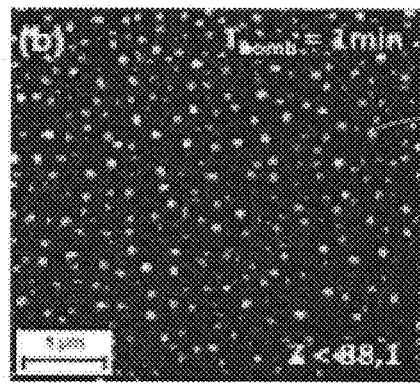
Figure 4C:
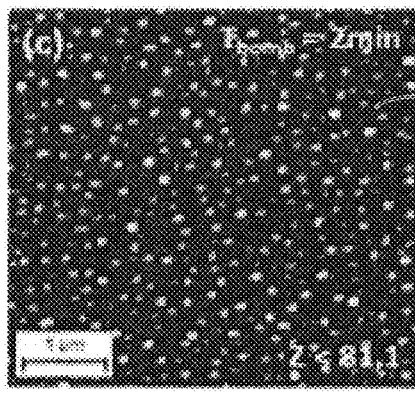
Figure 4D:
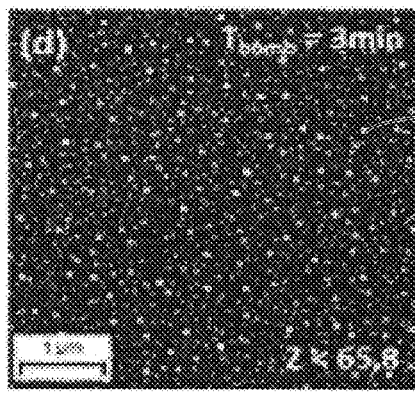
Figure 5A:
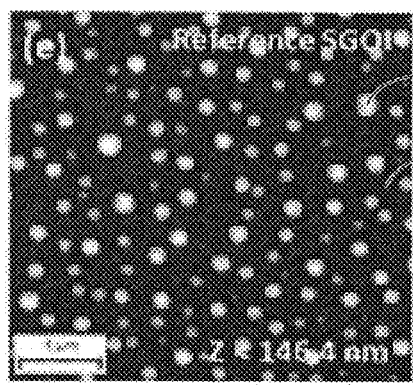
Figure 5B:
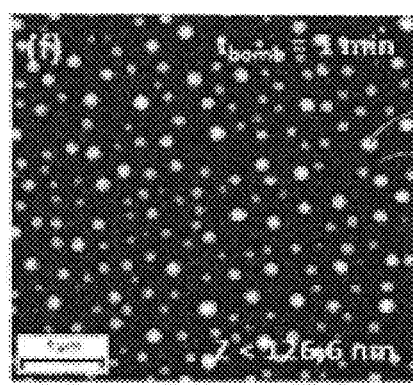
Figure 5C:
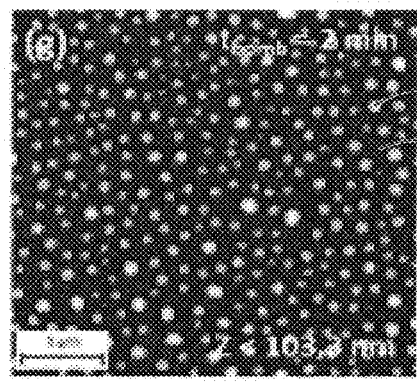
Figure 5D:
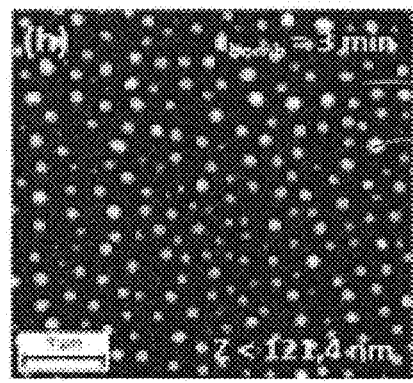

FIGS. 4B to 4D show the nanocrystals 112 obtained from a thin layer 102 of silicon having undergone an ion bombardment as described above for a duration equal to 1 minute (FIG. 4B), 2 minutes (FIG. 4C) or 3 minutes (FIG. 4D). As a comparison, FIG. 4A shows the nanocrystals 112 obtained when the thin layer 102 has not undergone ion bombardment. FIGS. 5B to 5D show the nanocrystals 112 obtained from a thin layer 102 of SiGe having undergone an ion bombardment as described above for a duration equal to 1 minute (FIG. 5B), 2 minutes (FIG. 5C) or 3 minutes (FIG. 5D). As a comparison, FIG. 5A shows the nanocrystals 112 obtained when the thin layer 102 has not undergone ion bombardment. The images of FIGS. 4A to 4D and 5A to 5D are obtained by an atomic force microscope operating in intermittent contact mode, or tapping mode (TM), after cooling of the sample to ambient temperature and after being taken out of the ultra-vacuum chamber.

The results obtained in FIGS. 4A to 4D and 5A to 5D do not depend on the lateral dimensions of the substrate 100 used since the areas having undergone the ion bombardment have very large dimensions compared to the thickness of the thin layer 102. One criterion considered is for example that the areas bombarded have a diameter at least 10 times greater than the thickness of the thin layer 102, and preferentially a diameter at least 100 times greater than the thickness of the thin layer 102. In addition, the images obtained correspond to measurements made far from the edges of the sample, in regions having undergone the dewetting phenomenon completely in order to avoid taking into account the influence of the edges of the dewetted areas.

The table below gives the maximum height (dimension substantially perpendicular to the surface of the dielectric layer 104 over which the nanocrystals 112 are formed) of the nanocrystals 112 observed in each of the cases indicated above, that is to say for both SOI and SGOI substrates 100, each subjected to an ion bombardment for a zero duration or equal to 1, 2 or 3 minutes.

|  | 0 minute | 1 minute | 2 minutes | 3 minutes |
| --- | --- | --- | --- | --- |
| SOI | 157.2 nm | 88.1 nm | 81.1 nm | 65.8 nm |
| SGOI | 146.4 nm | 126.6 nm | 103.3 nm | 121.4 nm |

The above table shows that, at equivalent ion bombardment duration, the maximum height of the nanocrystals 112 obtained from the thin layer 102 of silicon is less than that obtained with the thin layer 102 of SiGe.

In addition, at equivalent ion bombardment duration, the surface density with which the nanocrystals 112 obtained from the thin layer 102 of silicon are distributed is greater than that obtained from the thin layer 102 of SiGe. Finally, by considering either the thin layer 102 of silicon, or the thin layer 102 of SiGe, the longer the duration of the ion bombardment, the greater the surface density of the nanocrystals 112 obtained and the smaller the average dimensions of the nanocrystals 112.

Figure 6:
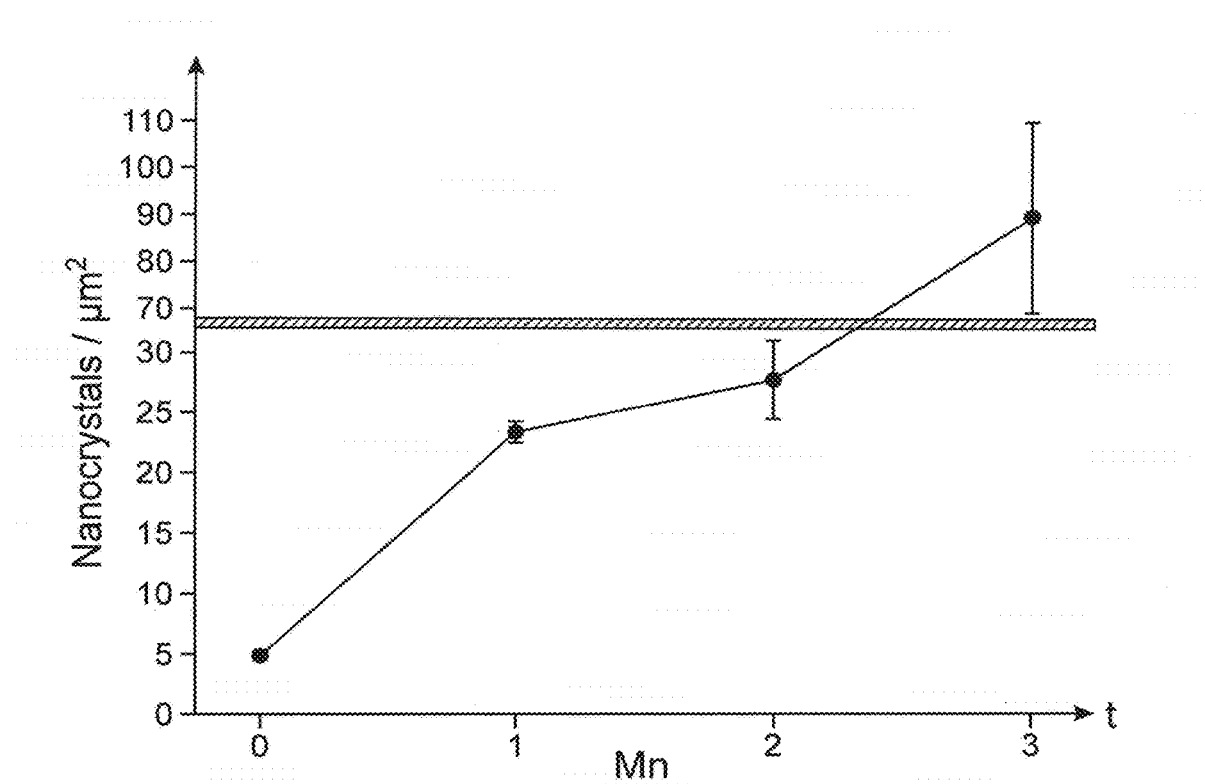
FIGS. 6 and 7 show measurements of the surface density of nanocrystals obtained by varying the duration of an ion bombardment implemented in the course of the method for producing nanocrystals.

FIG. 6 shows measurements of the surface density of the nanocrystals 112 obtained from an SOI substrate as a function of the duration of the ion bombardment undergone by the thin layer 102 of silicon. These measurements clearly illustrate that the longer the duration of the ion bombardment undergone by the thin layer 102 of silicon, the higher the surface density of the nanocrystals 112 obtained: 5+/−0.5 nanocrystals/$\mu m^2$ in the absence of ion bombardment, 23+/−3 nanocrystals/$\mu m^2$ with an ion bombardment of a duration equal to around 1 minute, 28+/−4 nanocrystals/$\mu m^2$ with an ion bombardment of a duration equal to around 2 minutes, and 90+/−20 nanocrystals/$\mu m^2$ with an ion bombardment of a duration equal to around 3 minutes.

Figure 7:
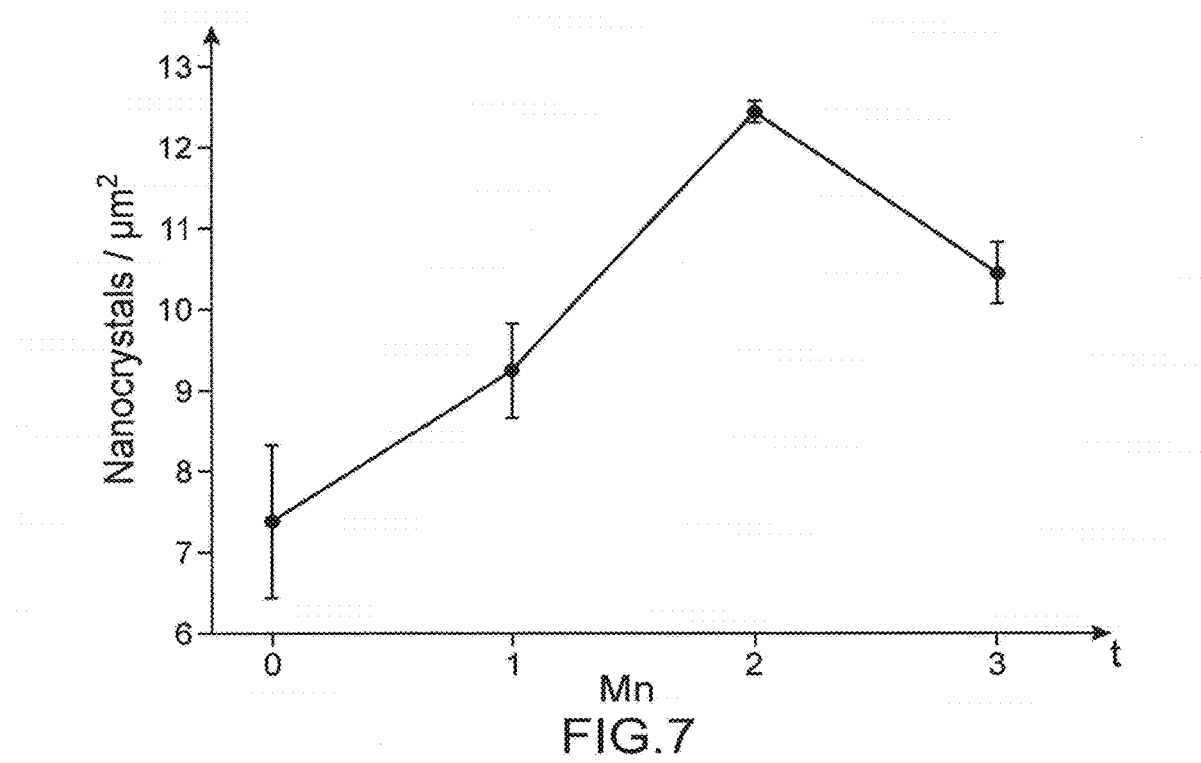

FIG. 7 shows measurements of the surface density of the nanocrystals 112 obtained from a SGOI substrate as a function of the duration of the ion bombardment undergone by the thin layer 102 of SiGe. As for the thin layer 102 of silicon, the increase in the duration of the ion bombardment leads to an increase in the surface density of the nanocrystals 112 obtained: 7.4+/−0.9 nanocrystals/$\mu m^2$ in the absence of ion bombardment, 9.2+/−0.6 nanocrystals/$\mu m^2$ with an ion bombardment of a duration equal to around 1 minute, 12.4+/−0.2 nanocrystals/$\mu m^2$ with an ion bombardment of a duration equal to around 2 minutes. In the measurements shown in FIG. 7, the surface density of nanocrystals obtained with an ion bombardment of a duration equal to 3 minutes is less than that obtained with an ion bombardment of a duration equal to 2 minutes. Nevertheless, the surface density of the nanocrystals obtained with an ion bombardment of a duration equal to 3 minutes is 1.5 times greater than that obtained in the absence of ion bombardment.

For a thin layer 102 of silicon, and for an ion bombardment of a duration t such that 0<t≤3 minutes, the surface density ρ with which the nanocrystals 112 are distributed on the dielectric layer 104 is such that 5+/−0.5<ρ<90+/−20 nanocrystals/$\mu m^2$. For a thin layer 102 of SiGe, and for an ion bombardment of a duration t such that 0<t≤3 minutes, the surface density ρ obtained is such that 7.5+/−0.9<ρ<12.5+/−0.2 nanocrystals/$\mu m^2$.

Thus, whatever the duration (non-zero) of the ion bombardment, and whether for a thin layer 102 of silicon or for a thin layer 102 of SiGe, the surface density of the nanocrystals 112 obtained by implementing an ion bombardment of the thin layer 102 prior to the annealing leading to the dewetting of the semiconductor of the thin layer 102 and the formation of nanocrystals 112 is greater than that obtained when no ion bombardment is carried out before the annealing of the thin layer 102.

Figure 8:
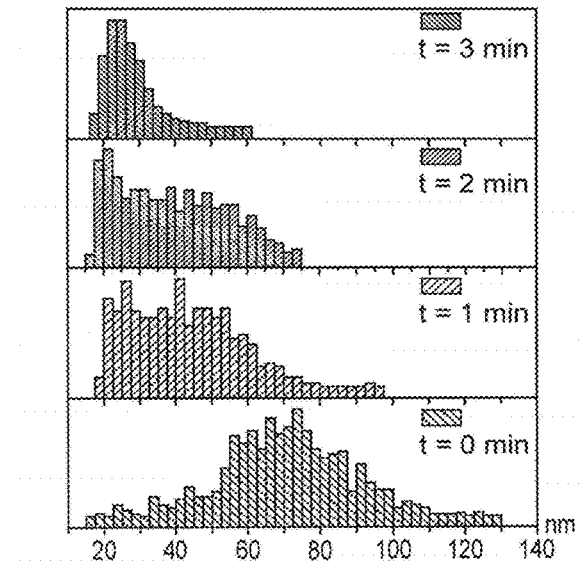
FIGS. 8 to 10 show measurements of the height, the diameter and the distance between two neighbouring nanocrystals obtained by varying the duration of an ion bombardment implemented in the course of the method for producing nanocrystals.

FIG. 8 shows, in the form of histograms, the heights of the nanocrystals 112 obtained from the thin layer 102 of silicon in the absence of ion bombardment (t=0 min) and for ion bombardments of duration t equal to 1, 2 or 3 minutes. The average height of these nanoparticles 112 is around 75+/−20 nm in the absence of ion bombardment, around 50+/−30 nm with an ion bombardment of a duration equal to 1 minute, around 40+/−20 nm with an ion bombardment of a duration equal to 2 minutes, and around 25+/−10 nm with an ion bombardment of a duration equal to 3 minutes.

Figure 9:
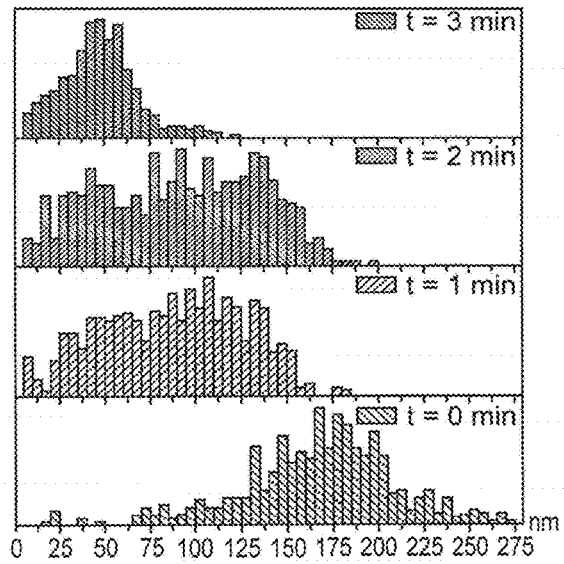

FIG. 9 shows, in the form of histograms, the diameters of the nanocrystals 112 (or more precisely the lateral dimensions, or dimensions parallel to the plane of the surface of the dielectric layer 104 on which the nanocrystals 112 are formed, nanocrystals 112 due to the fact that the nanocrystals 112 are not necessarily of spherical shape) obtained from the thin layer 102 of silicon in the absence of ion bombardment (t=0 min) and for ion bombardments of duration t equal to 1, 2 or 3 minutes. The average diameters of these nanocrystals 112 are around 180+/−30 nm in the absence of ion bombardment, around 100+/−30 nm with an ion bombardment of a duration equal to 1 minute, around 100+/−40 nm with an ion bombardment of a duration equal to 2 minutes, and around 50+/−15 nm with an ion bombardment of a duration equal to 3 minutes.

Figure 10:
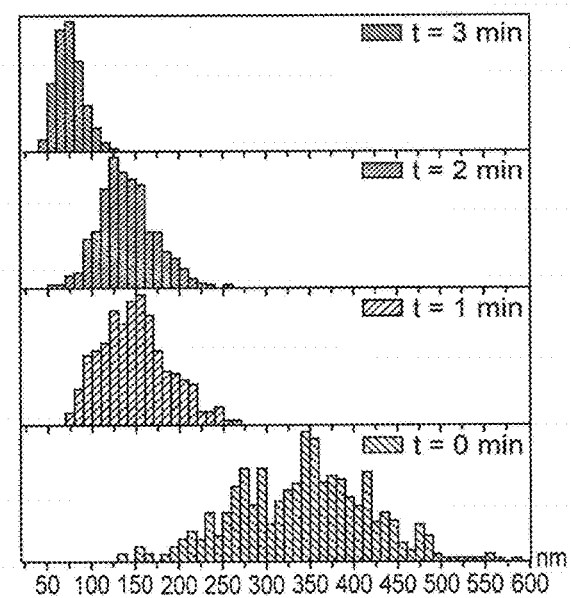

FIG. 10 shows, in the form of histograms, the distances between two neighbouring nanocrystals 112 (these distances being representative of the distribution density of the nanocrystals 112 on the dielectric layer 104) obtained from the thin layer 102 of silicon in the absence of ion bombardment (t=0 min) and for ion bombardments of duration t equal to 1, 2 or 3 minutes. Since dewetting is a process that keeps the material dewetted, the reduction in the dimensions of the nanocrystals 112 generated by the implementation of the ion bombardment is accompanied by an increase in the surface density of the nanocrystals 112 formed on the dielectric layer 104. In the absence of ion bombardment, this average distance between two neighbouring nanocrystals 112 is equal to around 350+/−100 nm. With an ion bombardment implemented for around 1 minute, this average distance between two neighbouring nanocrystals 112 is equal to around 150+/−50 nm. With an ion bombardment implemented for around 2 minutes, this average distance between two neighbouring nanocrystals 112 is equal to around 135+/−40 nm. Finally, with an ion bombardment implemented for around 3 minutes, this average distance between two neighbouring nanocrystals 112 is equal to around 75+/−20 nm. The histograms of FIG. 10 also show that the distribution of these distances, that is to say the difference between the minimum and maximum values is reduced when an ion bombardment is implemented, and that this reduction is greater when the duration of the ion bombardment increases.

The different measurements indicated above are obtained by atomic force microscopy. Other methods may also enable similar information to be obtained, such as for example scanning electron microscopy which makes it possible to have access to the lateral dimensions of the nanocrystals and to their surface density.

FIGS. 8 to 10 clearly show the significant impact of ion bombardment over the heights, the lateral dimensions and the surface density of the nanocrystals 112 obtained. Overall, the longer the duration of the ion bombardment, the smaller the heights and the lateral dimensions of the nanocrystals 112 and the higher the surface density of the nanocrystals 112. The duration of the ion bombardment is chosen as a function of the desired dimensions and surface density for the nanocrystals 112, as well as the thickness of the thin layer 102 of semiconductor and the nature of the ions implanted in the semiconductor.

The nanocrystals 112 of semiconductor formed on the dielectric layer 104 may then serve to produce electronic devices of nanometric dimensions, such as memory devices in which the electrically active areas correspond to the nanocrystals 112. The nanocrystals 112 may also be used as light emitting elements by taking advantage of their photoluminescence, for example for the production of LED (Light Emitting Diode) type devices.

The annealing may be carried out until the totality of the semiconductor of the thin layer 102 is dewetted and forms the nanocrystals 112. By extending the annealing (or beginning, after the dewetting, another annealing) after the dewetting of the totality of the semiconductor, and on account of the high temperature, the nanocrystals 112 may react with the material of the dielectric layer 104, in so far as a reactivity exists between the material of the layer 102 and that of the layer 104. In the case of nanocrystals 112 of silicon, the following reaction is obtained: $SiO_2+Si \rightarrow 2\ SiO$. Due to the fact that the SiO evaporates, silicon then forms through the dielectric layer 104 of the holes. It is thus possible to obtain a porous dielectric layer of which the dimensions and the surface density of the holes are controlled via the control of the dimensions and surface density of the nanocrystals 112. Electrically conductive material may then be deposited in these holes to form conductive vias. From the porous dielectric layer, it is also possible to produce for example an array of electrical capacitances, or instead a microporous membrane. Details of producing such a porous dielectric layer and different possible applications are given in the documents EP 2 521 162 A1 and EP 2 521 161 A1.

Finally, the nanocrystals 112 may also be used as catalysts to carry out a synthesis of carbon nanotubes.

The invention claimed is:

1. Method for producing nanocrystals of semiconductor, comprising at least:
   ion bombardment of a thin layer of semiconductor arranged on at least one dielectric layer, achieving at least one among an implantation of ions of at least one chemical element of rare gas type and an implantation of ions of at least one semiconductor element of same nature as that of the thin layer, in at least one part of the thickness of the thin layer;
   annealing of the thin layer achieving a dewetting of the semiconductor of the thin layer and forming, on the dielectric layer, nanocrystals of semiconductor.

2. Method according to claim 1, in which the duration during which the ion bombardment is implemented is a function of the energy with which the ions are implanted, the desired dimensions of the nanocrystals of semiconductor and the desired distribution surface density of the nanocrystals of semiconductor on the dielectric layer.

3. Method according to claim 1, in which the ion bombardment is implemented under a pressure less than or equal to around $10^{-7}$ Pa.

4. Method according to claim 1, in which the thickness of the thin layer is between around 1 nm and 100 nm.

5. Method according to claim 1, in which the semiconductor is monocrystalline silicon or monocrystalline silicon-germanium.

6. Method according to claim 1, in which the annealing is implemented at a temperature between around 700° C. and 1000° C.

7. Method according to claim 1, in which the ion bombardment and the annealing are implemented in an enclosure capable of carrying out the annealing at a temperature between around 700° C. and 1000° C. and under controlled atmosphere.

8. Method according to claim 7, in which the ion bombardment and the annealing are implemented in an ultra-vacuum enclosure of an atomic force microscope.

* * * * *